(12) United States Patent
Wang et al.

(10) Patent No.: US 10,991,660 B2
(45) Date of Patent: Apr. 27, 2021

(54) SEMICONDUCTOR PACKAGE HAVING HIGH MECHANICAL STRENGTH

(71) Applicant: Alpha and Omega Semiconductor (Cayman) Ltd., Sunnyvale, CA (US)

(72) Inventors: Long-Ching Wang, Cupertino, CA (US); Zhen Du, Shanghai (CN); Bo Chen, Shanghai (CN); Jun Lu, San Jose, CA (US); Yueh-Se Ho, Sunnyvale, CA (US)

(73) Assignee: ALPHA ANC OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 316 days.

(21) Appl. No.: 15/849,295

(22) Filed: Dec. 20, 2017

(65) Prior Publication Data
US 2019/0189569 A1 Jun. 20, 2019

(51) Int. Cl.
*H01L 23/00* (2006.01)
*H01L 21/02* (2006.01)
*H01L 23/48* (2006.01)
*H01L 21/78* (2006.01)
*H01L 23/31* (2006.01)

(52) U.S. Cl.
CPC ...... *H01L 23/562* (2013.01); *H01L 21/02032* (2013.01); *H01L 21/78* (2013.01); *H01L 23/3114* (2013.01); *H01L 23/481* (2013.01); *H01L 24/06* (2013.01); *H01L 2221/68318* (2013.01)

(58) Field of Classification Search
CPC . H01L 23/562; H01L 21/02032; H01L 21/78; H01L 23/481; H01L 24/06; H01L 23/3114; H01L 2221/68318
See application file for complete search history.

(56) References Cited

U.S. PATENT DOCUMENTS

| | | | | | |
|---|---|---|---|---|---|
| 4,616,413 | A | * | 10/1986 | Iliou | ...................... H05K 1/024 156/307.3 |
| 6,281,042 | B1 | * | 8/2001 | Ahn | ................... H01L 23/49827 257/723 |
| 6,392,290 | B1 | * | 5/2002 | Kasem | ................ H01L 21/6835 257/678 |

(Continued)

*Primary Examiner* — Allen L Parker
*Assistant Examiner* — Charles N Ausar-El
(74) *Attorney, Agent, or Firm* — Chen-Chi Lin

(57) ABSTRACT

A semiconductor wafer is singulated to form a plurality of semiconductor packages. The semiconductor wafer has a semiconductor substrate, a metal layer, an adhesive layer, a rigid supporting layer, a passivation layer and a plurality of contact pads. A semiconductor package has a semiconductor substrate, a metal layer, an adhesive layer, a rigid supporting layer, a passivation layer and a plurality of contact pads. A thickness of the rigid supporting layer is larger than a thickness of the semiconductor substrate. A thickness of the metal layer is thinner than the thickness of the semiconductor substrate. An entirety of the rigid supporting layer may be made of a single crystal silicon material or a poly-crystal silicon material. The single crystal silicon material or the poly-crystal silicon material may be fabricated from a reclaimed silicon wafer. An advantage of using a reclaimed silicon wafer is for a cost reduction.

19 Claims, 4 Drawing Sheets

(56) References Cited

U.S. PATENT DOCUMENTS

| | | | | |
|---|---|---|---|---|
| 6,493,240 | B2* | 12/2002 | Broglia | H05K 1/141 |
| | | | | 361/736 |
| 7,186,629 | B2* | 3/2007 | Wesselmann | B24B 37/34 |
| | | | | 257/678 |
| 7,459,782 | B1* | 12/2008 | Li | H01L 23/36 |
| | | | | 257/702 |
| 7,675,186 | B2* | 3/2010 | Chen | H01L 23/13 |
| | | | | 257/790 |
| 7,842,543 | B2* | 11/2010 | Wu | H01L 23/544 |
| | | | | 438/106 |
| 8,513,792 | B2* | 8/2013 | Ganesan | H01L 21/50 |
| | | | | 257/686 |
| 9,633,869 | B2* | 4/2017 | Chiu | H01L 23/49816 |
| 10,090,255 | B2* | 10/2018 | Hedrick | H01L 23/562 |
| 10,153,190 | B2* | 12/2018 | Qin | H01L 21/76251 |
| 2002/0003232 | A1* | 1/2002 | Ahn | G02B 6/4201 |
| | | | | 257/81 |
| 2008/0157283 | A1* | 7/2008 | Moslehi | H01L 31/042 |
| | | | | 257/618 |
| 2008/0233710 | A1* | 9/2008 | Hsu | H01L 21/823475 |
| | | | | 438/455 |
| 2013/0236711 | A1* | 9/2013 | Lu | B32B 27/30 |
| | | | | 428/213 |
| 2014/0064445 | A1* | 3/2014 | Adler | G21K 7/00 |
| | | | | 378/43 |
| 2014/0175628 | A1* | 6/2014 | Pan | H01L 24/37 |
| | | | | 257/676 |
| 2014/0264835 | A1* | 9/2014 | Wang | H01L 23/49811 |
| | | | | 257/737 |
| 2014/0315350 | A1* | 10/2014 | Xue | H01L 24/94 |
| | | | | 438/110 |
| 2015/0262972 | A1* | 9/2015 | Katkar | H01L 21/561 |
| | | | | 257/48 |
| 2015/0270209 | A1* | 9/2015 | Woychik | H01L 21/52 |
| | | | | 257/774 |
| 2015/0303173 | A1* | 10/2015 | Maydar | H01L 23/49827 |
| | | | | 257/664 |
| 2016/0133535 | A1* | 5/2016 | Lopez | H01L 23/147 |
| | | | | 257/392 |
| 2016/0262256 | A1* | 9/2016 | Wang | H01L 51/003 |
| 2017/0033060 | A1* | 2/2017 | Niu | H01L 24/05 |
| 2017/0263544 | A1* | 9/2017 | Hiner | H01L 21/56 |
| 2017/0309578 | A1* | 10/2017 | Eid | H01L 21/485 |
| 2018/0082960 | A1* | 3/2018 | Bellotti | H01L 21/32051 |
| 2018/0114760 | A1* | 4/2018 | Fu | H01L 21/4857 |
| 2018/0130744 | A1* | 5/2018 | Chen | H01L 21/76877 |
| 2018/0166396 | A1* | 6/2018 | Lee | H01L 23/562 |
| 2019/0109122 | A1* | 4/2019 | Ong | H01L 21/4853 |
| 2019/0139907 | A1* | 5/2019 | Lin | H01L 23/562 |
| 2019/0164908 | A1* | 5/2019 | Lee | H01L 23/562 |
| 2020/0189919 | A1* | 6/2020 | Sachs | C30B 13/06 |

* cited by examiner

US 10,991,660 B2

SEMICONDUCTOR PACKAGE HAVING HIGH MECHANICAL STRENGTH

FIELD OF THE INVENTION

This invention relates generally to a semiconductor wafer having a semiconductor substrate less than one hundred microns. More particularly, the present invention relates to semiconductor packages fabricated from the semiconductor wafer having high mechanical strength.

BACKGROUND OF THE INVENTION

Semiconductor packages such as a common-drain metal-oxide-semiconductor field-effect transistor (MOSFET) chip scale package (CSP) for battery protection application and a semiconductor power package usually have a semiconductor substrate thickness of one hundred microns or more. The semiconductor substrate contributes a significant amount of DC resistance. It is advantageous to reduce the semiconductor substrate thickness to be less than one hundred microns so as to reduce the DC resistance and to increase the electrical performance.

The mechanical strength of the semiconductor package decreases when the semiconductor substrate thickness decreases. In examples of the present disclosure, a rigid supporting layer having Young's modulus of 100 gigapascals or higher is added to increase the mechanical strength.

SUMMARY OF THE INVENTION

The present invention discloses a semiconductor wafer. The semiconductor wafer is singulated to form a plurality of semiconductor packages. The semiconductor wafer has a semiconductor substrate, a metal layer, an adhesive layer, a rigid supporting layer, a passivation layer and a plurality of contact pads. A thickness of the rigid supporting layer is larger than a thickness of the semiconductor substrate. A thickness of the metal layer is thinner than the thickness of the semiconductor substrate. A semiconductor package has a semiconductor substrate, a metal layer, an adhesive layer, a rigid supporting layer, a passivation layer and a plurality of contact pads.

An entirety of the rigid supporting layer may be made of a single crystal silicon material or a poly-crystal silicon material. The single crystal silicon material or the poly-crystal silicon material may be fabricated from a reclaimed silicon wafer. An advantage of using a reclaimed silicon wafer is for a cost reduction. A reclaimed silicon wafer is a used silicon wafer or a recycled silicon wafer.

DETAILED DESCRIPTION OF THE INVENTION

Figure 1:
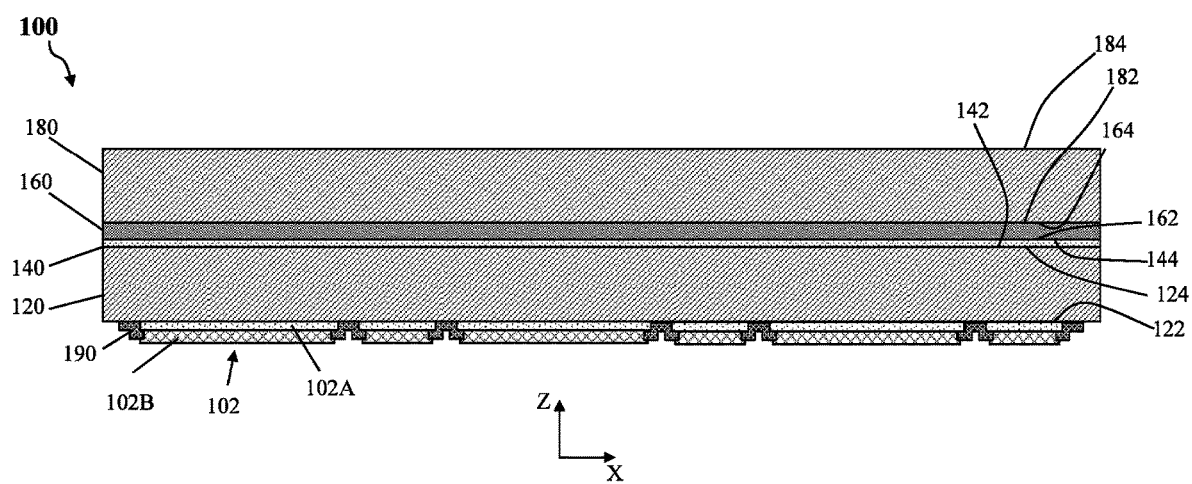
FIG. 1 is a side view of a semiconductor wafer in examples of the present disclosure.

FIG. 1 is a side view of a semiconductor wafer 100 in examples of the present disclosure. The semiconductor wafer 100 may be singulated to form a plurality of semiconductor packages (for example, reference number 260 of FIG. 2, reference number 300 of FIG. 3A, or reference number 400 of FIG. 4A). The semiconductor wafer 100 has a semiconductor substrate 120, a metal layer 140, an adhesive layer 160, a rigid supporting layer 180, and a plurality of contact pads 102. The adhesive layer 160 and the rigid supporting layer 180 are preferably non-conductive or are preferably made of an electrical insulation material. The semiconductor wafer 100 may also have an optional passivation layer 190. The number of the plurality of contact pads 102 may vary (though only six contact pads 102 are shown in FIG. 1). Each of the plurality of contact pads 102 may include an aluminum layer 102A and a nickel-gold layer 102B. The passivation layer 190 covers an edge of the aluminum layer 102A. A front surface of the nickel-gold layer 102B extends vertically beyond a front face of the passivation layer 190.

The semiconductor substrate 120 has a front surface 122 and a back surface 124. The back surface 124 is opposite to the front surface 122. The metal layer 140 has a front surface 142 and a back surface 144. The back surface 144 is opposite to the front surface 142. The adhesive layer 160 has a front surface 162 and a back surface 164. The back surface 164 is opposite to the front surface 162. The rigid supporting layer 180 has a front surface 182 and a back surface 184. The back surface 184 is opposite to the front surface 182.

In examples of the present disclosure, the front surface 142 of the metal layer 140 is directly attached to the back surface 124 of the semiconductor substrate 120. The front surface 162 of the adhesive layer 160 is directly attached to the back surface 144 of the metal layer 140. The front surface 182 of the rigid supporting layer 180 is directly attached to the back surface 164 of the adhesive layer 160. In one example, the plurality of contact pads 102 are attached to the front surface 122 of the semiconductor substrate 120. In another example, the plurality of contact pads 102 are directly attached to the front surface 122 of the semiconductor substrate 120.

In examples of the present disclosure, the passivation layer 190 is directly attached to the front surface 122 of the semiconductor substrate 120. The passivation layer 190 is also directly attached to side surfaces of the plurality of contact pads 102.

In examples of the present disclosure, the semiconductor substrate 120 contains a plurality of semiconductor devices (not shown). A respective back surface of each of the plurality of semiconductor devices and the back surface 124 of the semiconductor substrate 120 are co-planar. In examples of the present disclosure, a thickness of the plurality of semiconductor devices is less than or equal to 50 microns.

In examples of the present disclosure, the term "rigid" of the rigid supporting layer 180 refers to a material of the rigid supporting layer 180 stiffer than a tape material (for one example, a polyimide material. For another example, the protective tape of U.S. patent application Ser. No. 15/197,609 to Oh et al.). The rigid supporting layer 180 is to strengthen each of the plurality of semiconductor packages (for example, reference number 260 of FIG. 2, reference number 300 of FIG. 3A, or reference number 400 of FIG. 4A). The thinner the semiconductor substrate 120 is, the better the electrical performance of each of the plurality of semiconductor packages is. It is advantageous to have a thickness of the semiconductor substrate 120 being less than 85 microns. In examples of the present disclosure, the thickness of the semiconductor substrate 120 is in a range from 15 microns to 50 microns to achieve pre-determined electrical performance requirement. Each of the plurality of semiconductor packages is required to sustain a pre-determined force without breakage. The strength of the rigid supporting layer 180 is required to be even higher if a safety factor is included in the mechanical performance requirement of the semiconductor packages.

In examples of the present disclosure, a thickness is measured along a direction parallel to Z-axis of FIG. 1. In examples of the present disclosure, a thickness of the rigid supporting layer 180 is a shortest distance between the front surface 182 and the back surface 184. In examples of the present disclosure, a majority portion of the semiconductor substrate 120 is made of a silicon material. In examples of the present disclosure, the thickness of the rigid supporting layer 180 is larger than the thickness of the semiconductor substrate 120. In one example, the thickness of the semiconductor substrate is equal to or less than 50 microns and the thickness of the rigid supporting layer 180 is in a range from 50 microns to 300 microns. In examples of the present disclosure, it is preferred to have the semiconductor package (having a 3.05 mm×1.77 mm planar dimension) to sustain 2.15 Newtons without breakage.

In examples of the present disclosure, a thickness of the metal layer 140 is thinner than the thickness of the semiconductor substrate 120 so as to reduce overall weight of the semiconductor package. In examples of the present disclosure, the thickness of the metal layer 140 is in a range from 1 micron to 15 microns. In one example, an entirety of the metal layer 140 is made of nickel. In another example, an entirety of the metal layer 140 is made of copper. In still another example, an entirety of the metal layer 140 is made of aluminum. In yet another example, an entirety of the metal layer 140 is made of steel.

In examples of the present disclosure, an entirety of the rigid supporting layer 180 is made of a material having relatively high Young's modulus including a single crystal silicon material, a poly-crystal silicon material or a silicon nitride material ($Si_3N_4$). In examples of the present disclosure, an entirety of the rigid supporting layer 180 is made of a material having high Young's modulus including a Bismaleimide-Triazine material, a glass material, FR-4, FR-5, or a silicon oxide material ($SiO_2$). The advantages are cost effectiveness and lighter semiconductor package weight.

In examples of the present disclosure, an entirety of the rigid supporting layer 180 is made of a single crystal silicon material or a poly-crystal silicon material. In examples of the present disclosure, the single crystal silicon material or the poly-crystal silicon material is fabricated from a reclaimed silicon wafer. The advantage of using a reclaimed silicon wafer is for a cost reduction. A reclaimed silicon wafer is a used silicon wafer or a recycled silicon wafer. In one example, the used silicon wafer may be previously used for testing purpose. Etching processes and polishing processes are applied to the reclaimed silicon wafer to form the single crystal silicon material or the poly-crystal silicon material.

In examples of the present disclosure, an entirety of the rigid supporting layer 180 is made of a silicon nitride material.

In examples of the present disclosure, an entirety of the rigid supporting layer 180 is made of a Bismaleimide-Triazine material.

In examples of the present disclosure, an entirety of the rigid supporting layer 180 is made of a glass material.

In examples of the present disclosure, an entirety of the rigid supporting layer 180 is made of FR-4.

In examples of the present disclosure, an entirety of the rigid supporting layer 180 is made of FR-5.

In examples of the present disclosure, an entirety of the rigid supporting layer 180 is made of a silicon oxide material.

Figure 2:
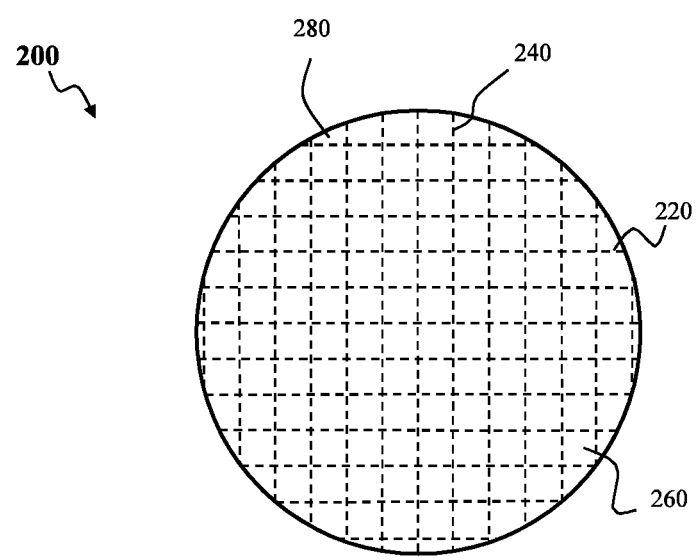
FIG. 2 is a back view of another semiconductor wafer having scribe lines in examples of the present disclosure.

FIG. 2 is a back view of a semiconductor wafer 200 to be singulated to form a plurality of semiconductor packages 260 in examples of the present disclosure. A plurality of horizontal scribe lines 220 and a plurality of vertical scribe lines 240 are formed on the semiconductor wafer 200. In examples of the present disclosure, the semiconductor wafer 200 is singulated along the plurality of scribe lines so as to form a plurality of separated semiconductor packages.

Figure 3A:
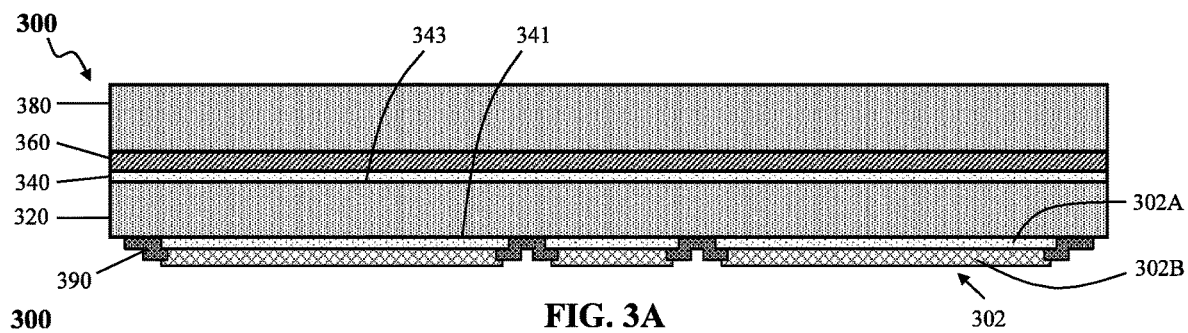
FIG. 3A is a cross-sectional view of a common-drain MOSFET CSP in examples of the present disclosure.
Figure 3B:
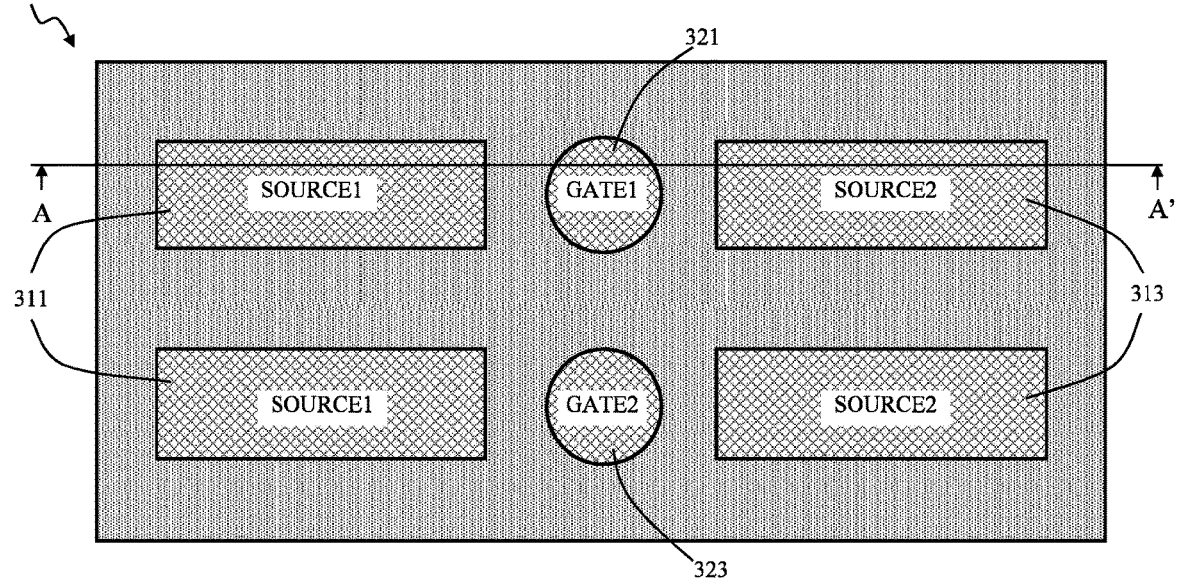
FIG. 3B is a front view of the common-drain MOSFET CSP of FIG. 3A in examples of the present disclosure.

FIG. 3B is a front view of a common-drain MOSFET CSP 300 in examples of the present disclosure. FIG. 3A is a cross-sectional view along plane AA' of the common-drain MOSFET CSP 300. In examples of the present disclosure, a semiconductor substrate 320 is a portion of the semiconductor substrate 120 of FIG. 1. A metal layer 340 is a portion of the metal layer 140 of FIG. 1. An adhesive layer 360 is a portion of the adhesive layer 160 of FIG. 1. A rigid supporting layer 380 is a portion of the rigid supporting layer 180 of FIG. 1. A passivation layer 390 is a portion of the passivation layer 190 of FIG. 1. Contact pads 302 are a portion of the plurality of contact pads 102 of FIG. 1. A contact pad 302 may include an aluminum layer 302A and a nickel-gold layer 302B.

The semiconductor package 300 has a semiconductor substrate 320, a metal layer 340, an adhesive layer 360, a rigid supporting layer 380, a passivation layer 390 and a plurality of contact pads 302. The number of the plurality of contact pads 302 may vary (though only three contact pads 302 are shown in FIG. 3A). Each of the plurality of contact pads 302 may include an aluminum layer 302A and a nickel-gold layer 302B.

In examples of the present disclosure, the passivation layer 390 is directly attached to the front surface 341 of the semiconductor substrate 320. The passivation layer 390 is also directly attached to side surfaces of the plurality of contact pads 302.

In examples of the present disclosure, the term "rigid" of the rigid supporting layer 380 refers to a material of the rigid supporting layer 380 stiffer than a tape material. In examples of the present disclosure, the thickness of the semiconductor substrate 320 is less than 85 microns and preferably in a range from 15 microns to 50 microns to achieve pre-determined electrical performance requirement. Each of the plurality of semiconductor packages is required to sustain a pre-determined force without breakage. The strength of the rigid supporting layer 380 is required to be even higher if a safety factor is included in the mechanical performance requirement of the semiconductor packages.

In examples of the present disclosure, two separate and independent gates 321 and 323 and two separate and independent sources 311 and 313 are on a front surface 341 of the common-drain MOSFET CSP 300. A common-drain is on a back surface 343 of the common-drain MOSFET CSP 300. The metal layer 340 is a single-piece with a continuous and uniform thickness covering an entire back surface 343 of the common-drain MOSFET CSP 300 (different from metal layer 440 of FIG. 4 having a space 481).

Figure 4A:
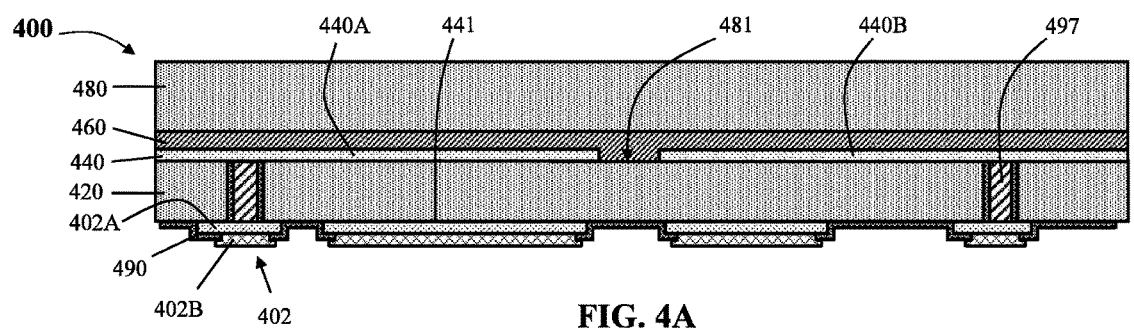
FIG. 4A is a cross-sectional view.
Figure 4B:
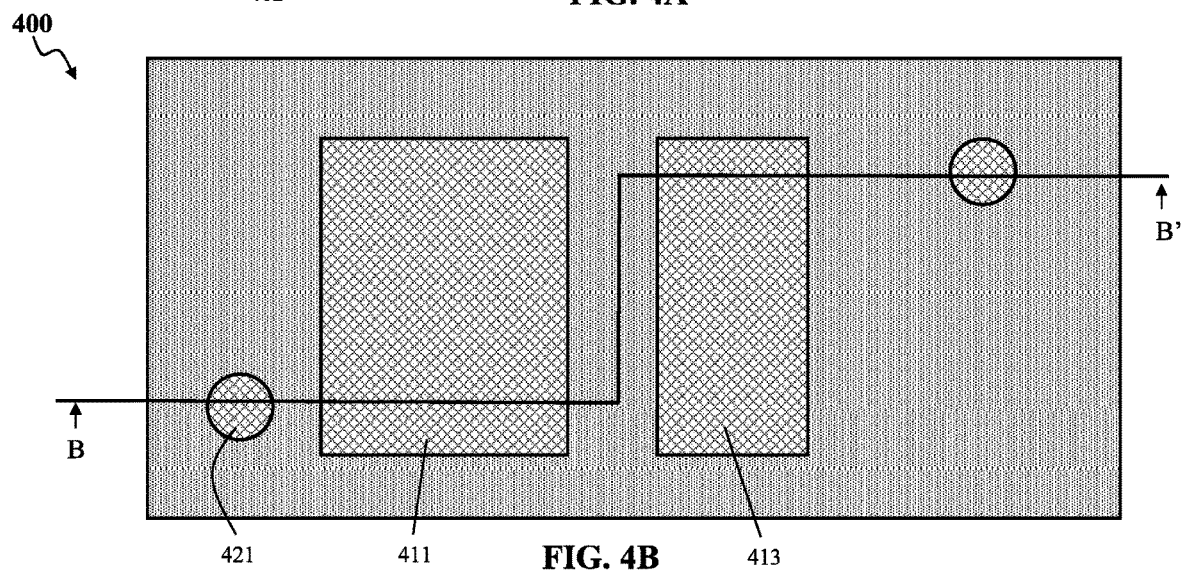
FIG. 4B is a front view of a semiconductor power package in examples of the present disclosure.

FIG. 4B is a front view of a semiconductor power package 400 in examples of the present disclosure. FIG. 4A is a cross-sectional view along plane BB' of the semiconductor power package 400. In examples of the present disclosure, a semiconductor substrate 420 is a portion of the semiconductor substrate 120 of FIG. 1. A metal layer 440 is a portion of the metal layer 140 of FIG. 1. An adhesive layer 460 is a portion of the adhesive layer 160 of FIG. 1. A rigid supporting layer 480 is a portion of the rigid supporting layer 180 of FIG. 1. A passivation layer 490 is a portion of the passivation layer 190 of FIG. 1. Contact pads 402 are a portion of the plurality of contact pads 102 of FIG. 1. A contact pad 402 may include an aluminum layer 402A and a nickel-gold layer 402B.

In examples of the present disclosure, a first electrode 411 and a second electrode 413 are on a front surface 441 of the semiconductor power package 400. The metal layer 440 is separated by a plurality of spaces 481 to form a plurality of metal pads 440A and 440B. The plurality of spaces 481 are filled with a same adhesive material as the adhesive layer 460. A plurality of vias 497 penetrate the semiconductor substrate 420 of the semiconductor power package 400. The plurality of vias 497 electrically and mechanically connect a plurality of contact pads 402 respectively to a plurality of metal pads 440A and 440B of metal layer 440.

Those of ordinary skill in the art may recognize that modifications of the embodiments disclosed herein are possible. For example, a total number of the plurality of contact pads 102 may vary. Other modifications may occur to those of ordinary skill in this art, and all such modifications are deemed to fall within the purview of the present invention, as defined by the claims.

The invention claimed is:

1. A semiconductor wafer comprising:
a semiconductor substrate having a front surface and a back surface opposite the front surface of the semiconductor substrate;
a metal layer having a front surface and a back surface opposite the front surface of the metal layer, the front surface of the metal layer being directly attached to the back surface of the semiconductor substrate;
an adhesive layer having a front surface and a back surface opposite the front surface of the adhesive layer, the front surface of the adhesive layer being directly attached to the back surface of the metal layer;
a rigid supporting layer having a front surface and a back surface opposite the front surface of the rigid supporting layer, the front surface of the rigid supporting layer being directly attached to the back surface of the adhesive layer; and
a plurality of contact pads directly attached to the front surface of the semiconductor substrate;
wherein a thickness of the rigid supporting layer is larger than a thickness of the semiconductor substrate;
wherein the rigid supporting layer is stiffer than a tape material;
wherein the thickness of the semiconductor substrate is equal to or less than 50 microns;
wherein a majority portion of the semiconductor substrate is made of a silicon material;
wherein the thickness of the rigid supporting layer is in a range from 50 microns to 300 microns;
wherein a thickness of the metal layer is thinner than the thickness of the semiconductor substrate; and
wherein the thickness of the metal layer is in a range from 1 micron to 15 microns.

2. The semiconductor wafer of claim 1 further comprising a passivation layer directly attached to the front surface of the semiconductor substrate and side surfaces of the plurality of contact pads.

3. The semiconductor wafer of claim 1, wherein an entirety of the rigid supporting layer is made of a single crystal silicon material or a poly-crystal silicon material.

4. The semiconductor wafer of claim 3, wherein the single crystal silicon material or the poly-crystal silicon material is fabricated from a reclaimed silicon wafer.

5. The semiconductor wafer of claim 1, wherein an entirety of the rigid supporting layer is made of a Bismaleimide-Triazine material.

6. The semiconductor wafer of claim 1, wherein an entirety of the rigid supporting layer is made of a material selected from the group consisting of glass, FR-4, FR-5, silicon oxide and silicon nitride.

7. The semiconductor wafer of claim 1, wherein an entirety of the metal layer is made of a material selected from the group consisting of nickel, copper, aluminum and steel.

8. The semiconductor wafer of claim 1, wherein a plurality of scribe lines are formed on the semiconductor wafer.

9. The semiconductor wafer of claim 8, wherein the semiconductor wafer is singulated along the plurality of scribe lines so as to form a plurality of separated semiconductor packages.

10. The semiconductor wafer of claim 1, wherein the adhesive layer and the rigid supporting layer are non-conductive.

11. A semiconductor package comprising:
a semiconductor substrate having a front surface and a back surface opposite the front surface of the semiconductor substrate;
a metal layer having a front surface and a back surface opposite the front surface of the metal layer, the front surface of the metal layer being directly attached to the back surface of the semiconductor substrate;
an adhesive layer having a front surface and a back surface opposite the front surface of the adhesive layer, the front surface of the adhesive layer being directly attached to the back surface of the metal layer;
a rigid supporting layer having a front surface and a back surface opposite the front surface of the rigid supporting layer, the front surface of the rigid supporting layer being directly attached to the back surface of the adhesive layer; and
a plurality of contact pads directly attached to the front surface of the semiconductor substrate;
wherein a thickness of the semiconductor substrate is equal to or less than 50 microns;
wherein a thickness of the rigid supporting layer is larger than the thickness of the semiconductor substrate; and
wherein the rigid supporting layer is stiffer than a tape material.

12. The semiconductor package of claim 11, wherein the semiconductor package is a common-drain metal-oxide-semiconductor field-effect transistor (MOSFET) chip scale package (CSP) for battery protection application;
wherein two gates and two sources are on a front surface of the common-drain MOSFET CSP; and
wherein a common-drain is on a back surface of the common-drain MOSFET CSP.

13. The semiconductor package of claim 11, wherein the semiconductor package is a semiconductor power package;
wherein a first electrode and a second electrode are on a front surface of the semiconductor power package;
wherein a plurality of vias penetrate the semiconductor substrate of the semiconductor power package; and
wherein the plurality of vias electrically and mechanically connect a plurality of contact pads to a plurality of metal pads.

14. The semiconductor package of claim 11, wherein spaces between the plurality of metal pads are filled with an adhesive material.

15. The semiconductor package of claim 11, wherein the adhesive layer and the rigid supporting layer are non-conductive.

16. The semiconductor package of claim 11, wherein an entirety of the rigid supporting layer is made of a single crystal silicon material or a poly-crystal silicon material.

17. The semiconductor package of claim 11, wherein an entirety of the rigid supporting layer is made of a Bismale-imide-Triazine material.

18. The semiconductor package of claim 11, wherein an entirety of the rigid supporting layer is made of a material selected from the group consisting of glass, FR-4, FR-5, silicon oxide and silicon nitride.

19. The semiconductor package of claim 11, wherein an entirety of the metal layer is made of a material selected from the group consisting of nickel, copper, aluminum and steel.

* * * * *